United States Patent
Segal et al.

(10) Patent No.: US 9,524,211 B1
(45) Date of Patent: Dec. 20, 2016

(54) CODEWORD MANAGEMENT

(71) Applicant: AVAGO TECHNOLOGIES GENERAL IP (SINGAPORE) PTE. LTD., Yishun (SG)

(72) Inventors: Avigdor Segal, Netanya (IL); Hanan Weingarten, Herzelia (IL); Igal Maly, Tel Aviv (IL)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 38 days.

(21) Appl. No.: 14/547,008

(22) Filed: Nov. 18, 2014

(51) Int. Cl.
  *G06F 11/10* (2006.01)
  *G11C 29/52* (2006.01)

(52) U.S. Cl.
  CPC ........... *G06F 11/1072* (2013.01); *G11C 29/52* (2013.01)

(58) Field of Classification Search
  CPC .................................................. G06F 11/1008
  USPC .................................................. 714/767, 784
  See application file for complete search history.

(56) References Cited

U.S. PATENT DOCUMENTS

| | | |
|---|---|---|
| 4,430,701 A | 2/1984 | Christian et al. |
| 4,463,375 A | 7/1984 | Macovski |
| 4,584,686 A | 4/1986 | Fritze |
| 4,589,084 A | 5/1986 | Fling et al. |
| 4,777,589 A | 10/1988 | Boettner et al. |
| 4,866,716 A | 9/1989 | Weng |
| 5,003,597 A | 3/1991 | Merkle |
| 5,077,737 A | 12/1991 | Leger et al. |
| 5,297,153 A | 3/1994 | Baggen et al. |
| 5,305,276 A | 4/1994 | Uenoyama |
| 5,592,641 A | 1/1997 | Doyle et al. |
| 5,600,662 A * | 2/1997 | Zook ........................ G06F 7/726 360/49 |
| 5,623,620 A | 4/1997 | Alexis et al. |
| 5,640,529 A | 6/1997 | Hasbun |
| 5,657,332 A | 8/1997 | Auclair et al. |
| 5,663,901 A | 9/1997 | Harari et al. |
| 5,724,538 A | 3/1998 | Morris |
| 5,729,490 A | 3/1998 | Calligaro et al. |
| 5,740,395 A | 4/1998 | Wells |
| 5,745,418 A | 4/1998 | Hu et al. |
| 5,778,430 A | 7/1998 | Ish |
| 5,793,774 A | 8/1998 | Usui et al. |
| 5,920,578 A | 7/1999 | Zook et al. |
| 5,926,409 A | 7/1999 | Engh et al. |
| 5,933,368 A | 8/1999 | Hu et al. |
| 5,956,268 A | 9/1999 | Lee |
| 5,956,473 A | 9/1999 | Hu et al. |

(Continued)

FOREIGN PATENT DOCUMENTS

WO   WO2009053963 A2   4/2009

OTHER PUBLICATIONS

Search Report of PCT Patent Application WO 2009/118720 A3, Mar. 4, 2010.

(Continued)

*Primary Examiner* — Fritz Alphonse

(57) ABSTRACT

A method for managing an encoding process, the method includes receiving or determining, by a processor, (i) code rates for multiple pages, and (ii) sizes of a plurality of data segments to be stored in the multiple pages after being encoded to provide multiple codewords; determining, by the processor, sizes of the multiple codewords while maintaining the code rates for the multiple pages and minimizing a number of split data segments out of the plurality of data segments, wherein each split data segment is split between at least two codewords of the multiple codewords, wherein a retrieval of the split data segment involves a retrieval of the at least two codewords; and sending to an encoder information about the sizes of the multiple codewords.

21 Claims, 5 Drawing Sheets

(56) References Cited

U.S. PATENT DOCUMENTS

| | | |
|---|---|---|
| 5,968,198 A | 10/1999 | Balachandran |
| 5,982,659 A | 11/1999 | Irrinki et al. |
| 6,011,741 A | 1/2000 | Harari et al. |
| 6,016,275 A | 1/2000 | Han |
| 6,038,634 A | 3/2000 | Ji et al. |
| 6,081,878 A | 6/2000 | Estakhri |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,128,270 B2 * | 10/2006 | Silverbrook .......... G06F 3/0317 235/462.45 |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park et al. |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett et al. |
| 7,388,781 B2 | 6/2008 | Litsyn |
| 7,395,404 B2 | 7/2008 | Gorobets |
| 7,441,067 B2 | 10/2008 | Gorobets et al. |
| 7,443,729 B2 | 10/2008 | Li et al. |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell |
| 7,619,922 B2 | 11/2009 | Li |
| 7,697,326 B2 | 4/2010 | Sommer et al. |
| 7,706,182 B2 | 4/2010 | Shalvi et al. |
| 7,716,538 B2 | 5/2010 | Gonzalez |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun |
| 7,961,797 B1 | 6/2011 | Yang et al. |
| 7,975,192 B2 | 7/2011 | Sommer |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang |
| 8,250,324 B2 | 8/2012 | Haas |
| 8,300,823 B2 | 10/2012 | Bojinov |
| 8,305,812 B2 | 11/2012 | Levy |
| 8,327,246 B2 | 12/2012 | Weingarten |
| 8,407,560 B2 | 3/2013 | Ordentlich |
| 8,417,893 B2 | 4/2013 | Khmelnitsky |
| 2001/0034815 A1 | 10/2001 | Dugan et al. |
| 2002/0063774 A1 | 5/2002 | Hillis et al. |
| 2002/0085419 A1 | 7/2002 | Kwon |
| 2002/0154769 A1 | 10/2002 | Petersen et al. |
| 2002/0156988 A1 | 10/2002 | Toyama |
| 2002/0174156 A1 | 11/2002 | Birru |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Lee |
| 2003/0192007 A1 | 10/2003 | Miller et al. |
| 2004/0015771 A1 | 1/2004 | Lasser et al. |
| 2004/0030971 A1 | 2/2004 | Tanaka |
| 2004/0059768 A1 | 3/2004 | Denk |
| 2004/0080985 A1 | 4/2004 | Chang et al. |
| 2004/0153722 A1 | 8/2004 | Lee |
| 2004/0153817 A1 | 8/2004 | Norman |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le Bars et al. |
| 2005/0144213 A1 | 6/2005 | Simkins et al. |
| 2005/0144368 A1 | 6/2005 | Chung et al. |
| 2005/0169057 A1 | 8/2005 | Shibata |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima |
| 2006/0071956 A1 * | 4/2006 | Lapstun .................. B41J 2/0452 347/5 |
| 2006/0101193 A1 | 5/2006 | Murin |
| 2006/0195651 A1 | 8/2006 | Estakhri |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen |
| 2007/0143561 A1 | 6/2007 | Gorobets |

(56) References Cited

U.S. PATENT DOCUMENTS

| | | |
|---|---|---|
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim |
| 2008/0116509 A1 | 5/2008 | Harari et al. |
| 2008/0126686 A1 | 5/2008 | Sokolov et al. |
| 2008/0127104 A1 | 5/2008 | Li |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0027961 A1 | 1/2009 | Park |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn |
| 2009/0132755 A1 | 5/2009 | Radke |
| 2009/0144598 A1 | 6/2009 | Yoon |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi |
| 2009/0287930 A1 | 11/2009 | Nagaraja |
| 2009/0300269 A1 | 12/2009 | Radke et al. |
| 2009/0323942 A1 | 12/2009 | Sharon |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang |
| 2011/0209028 A1 | 8/2011 | Post |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |
| 2012/0124273 A1 | 5/2012 | Goss et al. |
| 2012/0246391 A1 | 9/2012 | Meir |

OTHER PUBLICATIONS

Search Report of PCT Patent Application WO 2009/095902 A3, Mar. 4, 2010.

Search Report of PCT Patent Application WO 2009/078006 A3, Mar. 4, 2010.

(56) References Cited

OTHER PUBLICATIONS

Search Report of PCT Patent Application WO 2009/074979 A3, Mar. 4, 2010.
Search Report of PCT Patent Application WO 2009/074978 A3, Mar. 4, 2010.
Search Report of PCT Patent Application WO 2009/072105 A3, Mar. 4, 2010.
Search Report of PCT Patent Application WO 2009/072104 A3, Mar. 4, 2010.
Search Report of PCT Patent Application WO 2009/072103 A3, Mar. 4, 2010.
Search Report of PCT Patent Application WO 2009/072102 A3, Mar. 4, 2010.
Search Report of PCT Patent Application WO 2009/072101 A3, Mar. 4, 2010.
Search Report of PCT Patent Application WO 2009/072100 A3, Mar. 4, 2010.
Search Report of PCT Patent Application WO 2009/053963 A3, Mar. 4, 2010.
Search Report of PCT Patent Application WO 2009/053962 A3, Mar. 4, 2010.
Search Report of PCT Patent Application WO 2009/053961 A3, Mar. 4, 2010.
Search Report of PCT Patent Application WO 2009/037697 A3, Mar. 4, 2010.
Yani Chen, Kcshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-72 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com), Oct. 2005.
Todd K. Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1, Feb. 2005.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate nonvolatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com , 2005.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26, Dec. 2007.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

\* cited by examiner

```
┌─────────────────────────────────────────────────────────────────────────┐
│ Receiving or determining, by a processor, (i) code rates for multiple    │
│ pages, and (ii) sizes of a plurality of data segments to be stored in    │
│ the multiple pages after being encoded to provide multiple codewords.    │
│                                  310                                     │
└─────────────────────────────────────────────────────────────────────────┘
                                    │
                                    ▼
┌─────────────────────────────────────────────────────────────────────────┐
│ Determining, by the processor, sizes of the multiple codewords while     │
│ maintaining the code rates for the multiple pages and minimizing a       │
│ number of split data segments out of the plurality of data segments,     │
│ wherein each split data segment is split between at least two codewords  │
│ of the multiple codewords, **wherein a retrieval of the split data       │
│ segment involves a retrieval of the at least two codewords.** 320        │
│  ┌───────────────────────────────────────────────────────────────────┐  │
│  │ Determining the sizes of multiple codewords to minimize a number  │  │
│  │ of codewords that comprise at least a portion of at least two     │  │
│  │ data segments. 321                                                │  │
│  └───────────────────────────────────────────────────────────────────┘  │
│  ┌───────────────────────────────────────────────────────────────────┐  │
│  │ Determining the sizes of the multiple codewords so that at least  │  │
│  │ one page of the multiple pages comprises codewords that differ    │  │
│  │ from each other by a size of redundancy. 322                      │  │
│  └───────────────────────────────────────────────────────────────────┘  │
│  ┌───────────────────────────────────────────────────────────────────┐  │
│  │ Determining the sizes of multiple codewords to allow only up to a │  │
│  │ single codeword per page to comprise at least a portion of at     │  │
│  │ least two data segments. 323                                      │  │
│  └───────────────────────────────────────────────────────────────────┘  │
│  ┌───────────────────────────────────────────────────────────────────┐  │
│  │ Preventing a second page from storing a codeword that comprises   │  │
│  │ at least a portion of at least two data segments. 324             │  │
│  └───────────────────────────────────────────────────────────────────┘  │
│  ┌───────────────────────────────────────────────────────────────────┐  │
│  │ Determining the sizes of the multiple codewords so that at least  │  │
│  │ one codeword of the first page comprises at least a portion of at │  │
│  │ least two data segments. 325                                      │  │
│  └───────────────────────────────────────────────────────────────────┘  │
└─────────────────────────────────────────────────────────────────────────┘
                                    │
                                    ▼
┌─────────────────────────────────────────────────────────────────────────┐
│                      Responding to the determination. 330                │
│  ┌───────────────────────────────────────────────────────────────────┐  │
│  │ Storing the information about the sizes of the multiple codewords,│  │
│  │ informing a user about the sizes of the multiple codewords. 331   │  │
│  └───────────────────────────────────────────────────────────────────┘  │
│  ┌───────────────────────────────────────────────────────────────────┐  │
│  │ Sending to an encoder information about the sizes of the multiple │  │
│  │ codewords. The encoder may be included in a memory controller. 332│  │
│  └───────────────────────────────────────────────────────────────────┘  │
│  ┌───────────────────────────────────────────────────────────────────┐  │
│  │ Receiving the plurality of data segment and encoding the plurality│  │
│  │ of data segments to provide the multiple codewords, wherein the   │  │
│  │ encoding is responsive to the information about the sizes of the  │  │
│  │ multiple codewords. 333                                           │  │
│  └───────────────────────────────────────────────────────────────────┘  │
│  ┌───────────────────────────────────────────────────────────────────┐  │
│  │ Informing a user about the sizes of the multiple codewords. 334   │  │
│  └───────────────────────────────────────────────────────────────────┘  │
└─────────────────────────────────────────────────────────────────────────┘
```

300     FIG. 2

| NAND Flash Page. Example: 16KB + X redundancy 201 | | | |
|---|---|---|---|
| Codeword #1 251 Nominal code rate. Example: Payload + Redundancy 4KB + ¼X | Codeword #2 252 Nominal code rate. Example: Payload + Redundancy 4KB + ¼X | Codeword #3 253 Nominal code rate. Example: Payload + Redundancy 4KB + ¼X | Codeword #4 254 Nominal code rate. Example: Payload + Redundancy 4KB + ¼X |
| DS_1 111  231 | DS_2 112  232 | DS_3 113  233 | DS_4 114  234 |

| NAND Flash Page. Example: 16KB + X redundancy 202 | | | |
|---|---|---|---|
| Codeword #5 255 Higher than nominal code rate. E.g.: Payload + Redundancy 4KB + (¼X−0.2KB)*4/4.2 | Codeword #6 256 Higher than nominal code rate. E.g.: Payload + Redundancy 4KB + (¼X−0.2KB)*4/4.2 | Codeword #7 257 Higher than nominal code rate. E.g.: Payload + Redundancy 4KB + (¼X−0.2KB)*4/4.2 | Codeword #8 258 Higher than nominal code rate. Special Code Word. Example: Payload + Redundancy 4.8KB + (¼X−0.2KB)*4.8/4.2 |
| DS_5 115  235 | DS_6 116  236 | DS_7 117  237 | DS_8 118  238 |

| NAND Flash Page. Example: 16KB + X redundancy 203 | | | |
|---|---|---|---|
| Codeword #9 259 Lower rate. E.g.: Payload + Red. 3.2KB + (¼X+0.2KB)*3.2/3.8 | Codeword #10 260 Lower than nominal code rate. Example: Payload + Redundancy 4KB + (¼X+0.2KB)*4/3.8 | Codeword #11 261 Lower than nominal code rate. Example: Payload + Redundancy 4KB + (¼X+0.2KB)*4/3.8 | Codeword #12 262 Lower than nominal code rate. Example: Payload + Redundancy 4KB + (¼X+0.2KB)*4/3.8 |
| DS_9 119  239 | DS_10 120  240 | DS_11 121  241 | DS_12 122  242 |

FIG. 3

CODEWORD MANAGEMENT

BACKGROUND OF THE INVENTION

Flash memory devices such as NAND flash memory devices are built with rows of floating transistors. In single level cells (SLC) devices each transistor row is called page and can be programmed separately. SLC cells store a single bit of information per cell. In multiple level cells (MLC) devices each transistor holds several levels (multiple bits of information per cell), effectively each MLC flash row contains several pages. E.g. most significant bit (MSB) and Least significant bit (LSB) for 2 bit per cell flash devices, MSB, central significant bit (CSB) and LSB for 3 bit per cell.

A flash memory device, once programmed with data, may contain errors that may be present immediately or may be accumulated over the time. The amount of errors depends on many factors, including number of Program-Erase cycles page has undergone, time passed from programming moment, temperature and page physical properties.

In order to protect programmed data Error Correcting Codes (ECC) are used. Additionally to ECC other techniques may be used. E.g. DSP, data interleaving between several pages, etc.

Flash memory device rows may differ in their properties according to their physical location within flash memory block. In MLC flash devices different pages in a row (i.e. MSB, LSB) can have different properties too. There may be also difference in number of errors due to program coupling between pages, also called even and odd pages.

The reliability of a flash memory device depends on the reliability of all its components. The component with lowest reliability will define the reliability of entire system. In case on flash memory devices, pages with lowest reliability will define the reliability of entire system.

In order to get maximal reliability of the entire system, ECC code should fit page's quality. In a high quality page (i.e. less errors) a more relaxed ECC code can be used. In a lower quality page (i.e. more errors) a stronger ECC code can be used. Usually different ECC codes means different amount (or code rate) of code redundancy vs. payload data. Stronger code means more redundancy means lower code rate.

It is noted that the ECC may include applying a stronger ECC code than required. In such case lower code rate is got, more flash memory is used for redundancy, thus less capacity for user data. Such behavior is not optimal.

ECC code assignment with dependence on page reliability poses an implication Codeword size or Codeword Payload (AKA Payload) size changes from page to page. Such Code assignment technique can be called "Variable Code Rate". This is in contrast, where all codes are equal, called "Fixed Code".

Basic case of "Fixed Code" is "Nominal Code" which uses nominal amount of Bytes for user data and the rest for various Meta Data including ECC Meta Data. Nominal amount refers to the amount suggested by the specifications of the flash manufacturer.

A designer of system that includes a memory controller and a flash memory device may have several considerations in designing ECC codewords. Both reliability and performance considerations may be taken into account.

Once a code rate is set for a certain page it may contradict with other considerations such as a load imposed on the system in order to retrieve data segments as when a memory controller is requested to read a data segment (for example a 4 KB data segment), the memory controller must read all codewords that contain this data segment. I.e. round up to whole codewords. Even if only a small fraction of a data segment is contained by certain codeword. This causes transmission of more data over a link (or channel) between the flash memory device and the memory controller.

In some cases the amount of traffic may be twice the amount requested or even worse. This can cause performance degradation if the channel or ECC engine cannot support such traffic. It also causes power waste due to more channel and ECC engine operation.

FIG. 1 illustrates a prior art example of a relationship between codewords and data segments.

It is assumed that pages of the flash memory module are slightly longer than 16 KB and are designated to contain four data segments of 4 KB and codeword redundancies. Such configuration would be "Nominal Code". 4 KB is the mostly used data unit due to computer operation systems' "page" based approach.

Once code rate is variable, pages with higher code rate contain more than 16 KB of user data, and pages with lower code rata contain less than 16 KB of data.

The first till twelfth codewords codeword_1—codeword_12 151-162 include redundancy 131-142 respectively.

First page (flash page) 101 is of a size of 16 KB+X, wherein X is the overall size of the redundancy of that page. The first page 101 stores first till fourth codewords codeword_1 codeword_4 151-154.

Each one of codeword_1-codeword_4 151-154 has a size of 4 KB+X/4. The first till fourth codewords includes first to fourth data segments (4 KB each) DS_1-DS_4 111-114 and redundancy 131-134.

The first till fourth codewords 151-154 are of a nominal code rate. The first till fourth data segments 111-114 are not split between codewords. Each one of these data segments can be retrieved by a single codeword transfer.

Second page (flash page) 102 is of a size of (16 KB+X), wherein X is the overall size of the redundancy of that page. The second page 102 includes fifth till eighth codewords codeword_5-codeword_8 155-158. These codewords include redundancy 135-138.

Each one of codeword_5-codeword_8 155-158 has a size of 4 KB+X/4, wherein the payload is 4.2 KB and the redundancy is X/4-0.2 KB.

Each one of codeword_5-codeword_8 155-158 includes portions of two data segments:
 a. Codeword_5 155 includes portions of DS_5 115 and DS_6 116.
 b. Codeword_6 156 includes portions of DS_6 116 and DS_7 117.
 c. Codeword_7 158 includes portions of DS_7 117 and DS_8 118.
 d. Codeword_8 155 includes portions of DS_8 118 and DS_9 119.

The fifth till eighth codewords 155-158 are of a higher than nominal code rate. The fifth till ninth data segments 115-119 are split between codewords.

Third page (flash page) 103 is of a size of 16 KB+X, wherein X is the overall size of the redundancy of that page. The third page includes ninth till twelfth codewords codeword_9-codeword_12 159-162. These codewords include redundancy 139-142.

Each one of codeword_9-codeword_12 159-162 has a size of 4 KB+X/4, wherein the payload is 3.8 KB and the redundancy is X/4+0.2 KB.

Each one of codeword_9-codeword_11 159-161 includes portions of two data segments:

a. Codeword_9 159 includes portions of DS_9 119 and DS_10 120.
b. Codeword_10 160 includes portions of DS_10 120 and DS_11 121.
c. Codeword_11 161 includes portions of DS_11 121 and DS_12 122.
Codeword_12 162 includes a portion of DS_12 122.

The ninth till twelfth codewords 159-162 are of a lower than nominal code rate. The ninth till twelfth data segments 119-122 are split between codewords. Each one of these data segments can be retrieved by a transferring pair of codewords.

SUMMARY

According to an embodiment of the invention there may be provided a method for managing an encoding process, the method may include receiving or determining, by a processor, (i) code rates for multiple pages, and (ii) sizes of a plurality of data segments to be stored in the multiple pages after being encoded to provide multiple codewords; determining, by the processor, sizes of the multiple codewords while maintaining the code rates for the multiple pages and minimizing a number of split data segments out of the plurality of data segments, wherein each split data segment is split between at least two codewords of the multiple codewords wherein a retrieval of the split data segment involves a retrieval of the at least two codewords; and sending to an encoder information about the sizes of the multiple codewords.

The method may include receiving or determining, by the processor a flash memory transaction size; and wherein the determining of the sizes of the multiple codewords is further responsive to the flash memory transaction size.

The method may include determining the sizes of multiple codewords to minimize a number of codewords that may include at least a portion of two data segments.

The method may include determining the sizes of the multiple codewords so that at least one page of the multiple pages may include codewords that differ from each other by a size of redundancy.

The method may include determining the sizes of multiple codewords to allow only up to a single codeword per page to may include at least a portion of two data segments.

The code rates for the multiple pages may include a first code rate that is higher than a second code rate; wherein the first code rate is associated with a first page of the multiple pages and the second code rate is associated with a second page of the multiple pages.

The method may include preventing the second page from storing a codeword that may include at least a portion of two data segments.

The at least one codeword of the first page may include at least a portion of two data segments.

The method may include receiving the plurality of data segment and encoding the plurality of data segments to provide the multiple codewords, wherein the encoding is responsive to the information about the sizes of the multiple codewords.

According to an embodiment of the invention there may be provided a method for encoding data segments, the method may include receiving, by an encoder, information about sizes of multiple codewords to be generated by the encoder by encoding a plurality of codewords; wherein the sizes of the multiple codewords were determined (a) in response to code rates for multiple pages and sizes of the plurality of data segments, and (b) while maintaining the code rates for the multiple pages and minimizing a number of split data segments out of the plurality of data segments, wherein each split data segment is split between at least two codewords of the multiple codewords, wherein a retrieval of the split data segment involves a retrieval of the at least two codewords; receiving, by the encoder, the plurality of data segment; and encoding, by the encoder, the plurality of data segments to provide the multiple codewords, wherein the encoding is responsive to the information about the sizes of the multiple codewords.

According to an embodiment of the invention there may be provided a non-transitory computer readable medium may store instructions that once executed by an encoder cause the encoder to execute the stages of receiving information about sizes of multiple codewords to be generated by the encoder by encoding a plurality of codewords; wherein the sizes of the multiple codewords were determined (a) in response to code rates for multiple pages and sizes of the plurality of data segments, and (b) while maintaining the code rates for the multiple pages and minimizing a number of split data segments out of the plurality of data segments, wherein each split data segment is split between at least two codewords of the multiple codewords, wherein a retrieval of the split data segment involves a retrieval of the at least two codewords; receiving the plurality of data segment; and encoding the plurality of data segments to provide the multiple codewords, wherein the encoding is responsive to the information about the sizes of the multiple codewords.

The non-transitory computer readable medium may store instructions for receiving or determining, by the processor a flash memory transaction size; and wherein the determining of the sizes of the multiple codewords is further responsive to the flash memory transaction size.

The non-transitory computer readable medium may store instructions for determining the sizes of multiple codewords to minimize a number of codewords that may include at least a portion of two data segments.

The non-transitory computer readable medium may store instructions for determining the sizes of the multiple codewords so that at least one page of the multiple pages may include codewords that differ from each other by a size of redundancy.

The non-transitory computer readable medium may store instructions for determining the sizes of multiple codewords to allow only up to a single codeword per page to may include at least a portion of two data segments.

The code rates for the multiple pages may include a first code rate that is higher than a second code rate; wherein the first code rate is associated with a first page of the multiple pages and the second code rate is associated with a second page of the multiple pages.

The non-transitory computer readable medium may store instructions for preventing the second page from storing a codeword that may include at least a portion of two data segments.

At least one codeword of the first page may include at least a portion of two data segments.

The non-transitory computer readable medium may store instructions for receiving the plurality of data segment and encoding the plurality of data segments to provide the multiple codewords, wherein the encoding is responsive to the information about the sizes of the multiple codewords.

According to an embodiment of the invention there may be provided a non-transitory computer readable medium may store instructions that once executed by a processor cause the processor to execute the stage of receiving or determining (i) code rates for multiple pages, and (ii) sizes of a plurality of data segments to be stored in the multiple pages after being encoded to provide multiple codewords; determining sizes of the multiple codewords while maintaining the code rates for the multiple pages and minimizing a number of split data segments out of the plurality of data segments, wherein each split data segment is split between at least two codewords of the multiple codewords, wherein a retrieval of the split data segment involves a retrieval of the at least two codewords; and sending to an encoder information about the sizes of the multiple codewords.

According to an embodiment of the invention there may be provided a memory controller that may include an encoder; wherein the encoder is configured to receive information about sizes of multiple codewords to be generated by the encoder by encoding a plurality of codewords; wherein the sizes of the multiple codewords were determined (a) in response to code rates for multiple pages and sizes of the plurality of data segments, and (b) while maintaining the code rates for the multiple pages and minimizing a number of split data segments out of the plurality of data segments, wherein each split data segment is split between at least two codewords of the multiple codewords, wherein a retrieval of the split data segment involves a retrieval of the at least two codewords; receive the plurality of data segment; and encode the plurality of data segments to provide the multiple codewords, wherein the encoding is responsive to the information about the sizes of the multiple codewords.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 2 illustrates a method for managing an encoding process, according to an embodiment of the invention;

FIG. 3 illustrates an allocation of codewords and data segments according to an embodiment of the invention;

DETAILED DESCRIPTION OF THE DRAWINGS

Figure 1:
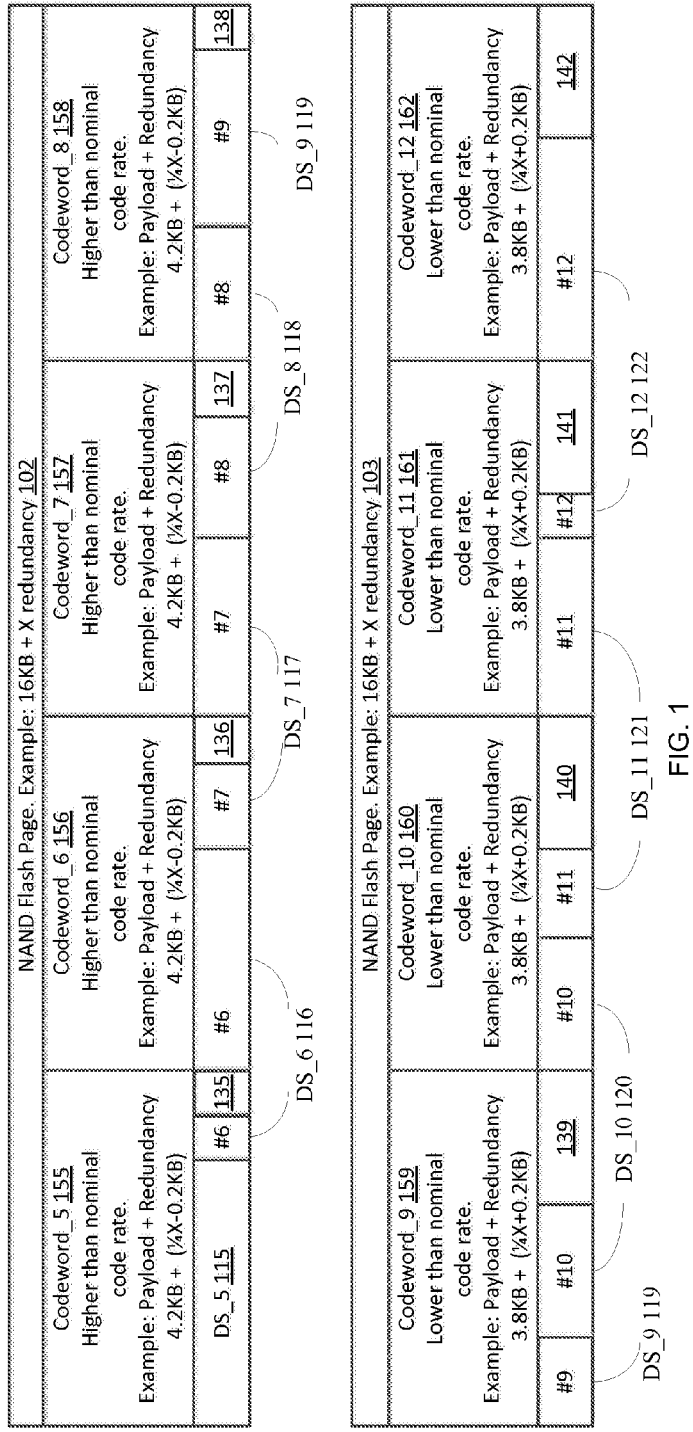
FIG. 1 illustrates a prior art example of a relationship between codewords and data segments.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

FIG. 2 illustrates method 300 for managing an encoding process, according to an embodiment of the invention.

Method 300 may start by stage 310 of receiving or determining, by a processor, (i) code rates for multiple pages, and (ii) sizes of a plurality of data segments to be stored in the multiple pages after being encoded to provide multiple codewords.

Stage 310 may be followed by stage 320 of determining, by the processor, sizes of the multiple codewords while maintaining the code rates for the multiple pages and minimizing a number of split data segments out of the plurality of data segments, wherein each split data segment is split between at least two codewords of the multiple codewords, wherein a retrieval of the split data segment involves a retrieval of the at least two codewords. This retrieval may require one or multiple flash memory transactions.

Stage 310 may include receiving a flash memory transaction size and stage 320 of determining may also be responsive to the flash memory transaction size.

Stage 320 may include at least one out of:
a. Stage 321 of determining the sizes of multiple codewords to minimize a number of codewords that comprise at least a portion of two data segments. Additionally or alternatively, stage 321 may include having a maximal number of data segments wherein each data segment is fully included in a single codeword.
b. Stage 322 of determining the sizes of the multiple codewords so that at least one page of the multiple pages comprises codewords that differ from each other by a size of redundancy.
c. Stage 323 of determining the sizes of multiple codewords to allow only up to a single codeword per page to comprise at least a portion of two data segments.
d. Stage 324 of preventing a second page from storing a codeword that comprises at least a portion of two data segments. It is noted that the code rates for the multiple pages may include a first code rate that is higher than a second code rate; wherein the first code rate is associated with a first page of the multiple pages and the second code rate is associated with a second page of the multiple pages.

e. Stage 325 of determining the sizes of the multiple codewords so that at least one codeword of the first page comprises at least a portion of two data segments.

Stage 320 may be followed by stage 330 of responding to the determination.

Stage 330 may include at least one out of:

a. Stage 331 of storing the information about the sizes of the multiple codewords.
b. Stage 332 of sending to an encoder information about the sizes of the multiple codewords. The encoder may be included in a memory controller. The sending to the encoder may include sending the information directly to the encoder or sending the information such that eventually the information may be provided to the encoder.
c. Stage 333 of receiving the plurality of data segments and encoding the plurality of data segments to provide the multiple codewords, wherein the encoding is responsive to the information about the sizes of the multiple codewords.
d. Stage 334 of informing a user about the sizes of the multiple codewords.

FIG. 3 illustrates an allocation of codewords and data segments according to an embodiment of the invention.

First page (flash page) 201 is of a size of (16 KB+X), wherein X is the overall size of the redundancy of that page. First page 201 includes first till fourth codewords denoted codeword #1-codeword #4 251-254.

Each one of codeword #1-codeword #4 251-254 has a size of 4 KB+X/4. These codewords include first to fourth data segments (4 KB each) DS_1-DS_4 111-114 and redundancy 231-234.

The first till fourth codewords 251-254 are of a nominal code rate. The first till fourth data segments 111-114 are not split between codewords. Each one of these data segments can be retrieved by a single transfer.

Second page (flash page) 202 is of a size of (16 KB+X), wherein X is the overall size of the redundancy of that page. Second page 202 includes fifth till ninth codewords codeword #5-codeword #8 255-258. These codewords include redundancy 235-238.

Each one of codeword #5-codeword #7 255-257 has a size of 4 KB+(X/4−0.2 KB)*4/4.2, wherein the payload is 4 KB and the redundancy is (X/4−0.2 KB)*4/4.2.

Each one of codeword #5-codeword #7 255-257 includes a single data segment–fifth till seventh codewords (codeword #5-codeword #7 255-258) include first to seventh data segments DS_5-DS_7 115-117.

The eighth codeword (codeword #8 258) includes the entire eighth data segment DS_8 118 and a first portion of the ninth data segment DS_9 119.

The fifth till eighth codewords 255-258 are of a higher than nominal code rate. Only the ninth data segment 119 is split between codewords.

Third page (flash page) 203 is of a size of (16 KB+X), wherein X is the overall size of the redundancy of that page. The third page includes the ninth till twelfth codewords —codeword #9-#12 259-262. These codewords include redundancy 239-242.

Each one of codeword #10-codeword #12 260-262 has a size of 4 KB+(X/4+0.2 KB)*4/3.8. The payload is 4 KB and the redundancy is (X/4+0.2 KB)*4/3.8.

The size of the ninth codeword (codeword #9) is payload 3.2 KB and redundancy (X/4+0.2 KB)*3.2/3.8.

Each one of codeword #10-codeword #12 260-262 includes a single data segment.

The eighth till twelfth codewords 259-262 are of a lower than nominal code rate. Only the ninth data segment 119 is split between codewords and also split between pages. Each one of the tenth till twelfth data segments can be retrieved by a single transfer.

Figure 4:
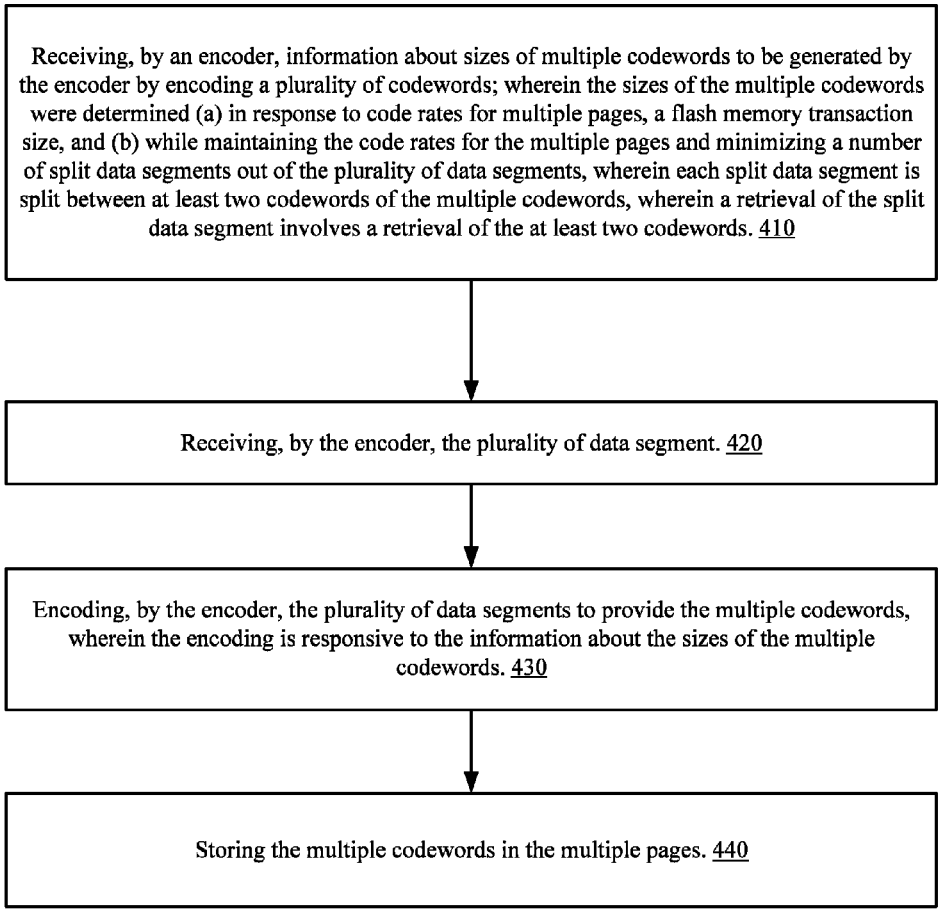
FIG. 4 illustrates a method for encoding data segments, according to an embodiment of the invention.

FIG. 4 illustrates method 400 for encoding data segments, according to an embodiment of the invention.

Method 400 may use information about a size of multiple codewords that were determined by method 300.

Method 400 may start by stage 410 of receiving, by an encoder, information about sizes of multiple codewords to be generated by the encoder by encoding a plurality of codewords; wherein the sizes of the multiple codewords were determined (a) in response to code rates for multiple pages, and sizes of the plurality of data segments, and (b) while maintaining the code rates for the multiple pages and minimizing a number of split data segments out of the plurality of data segments, wherein each split data segment is split between at least two codewords of the multiple codewords, wherein a retrieval of the split data segment involves a retrieval of the at least two codewords. This may involve multiple flash memory transactions. The sizes may have been determined also in response to a flash memory transaction size.

Stage 410 may be followed by stage 420 of receiving, by the encoder, the plurality of data segment.

Stage 420 may be followed by stage 430 of encoding, by the encoder, the plurality of data segments to provide the multiple codewords, wherein the encoding is responsive to the information about the sizes of the multiple codewords.

Stage 430 may be followed by stage 440 of storing the multiple codewords in the multiple pages (of a flash memory module).

Figure 5:
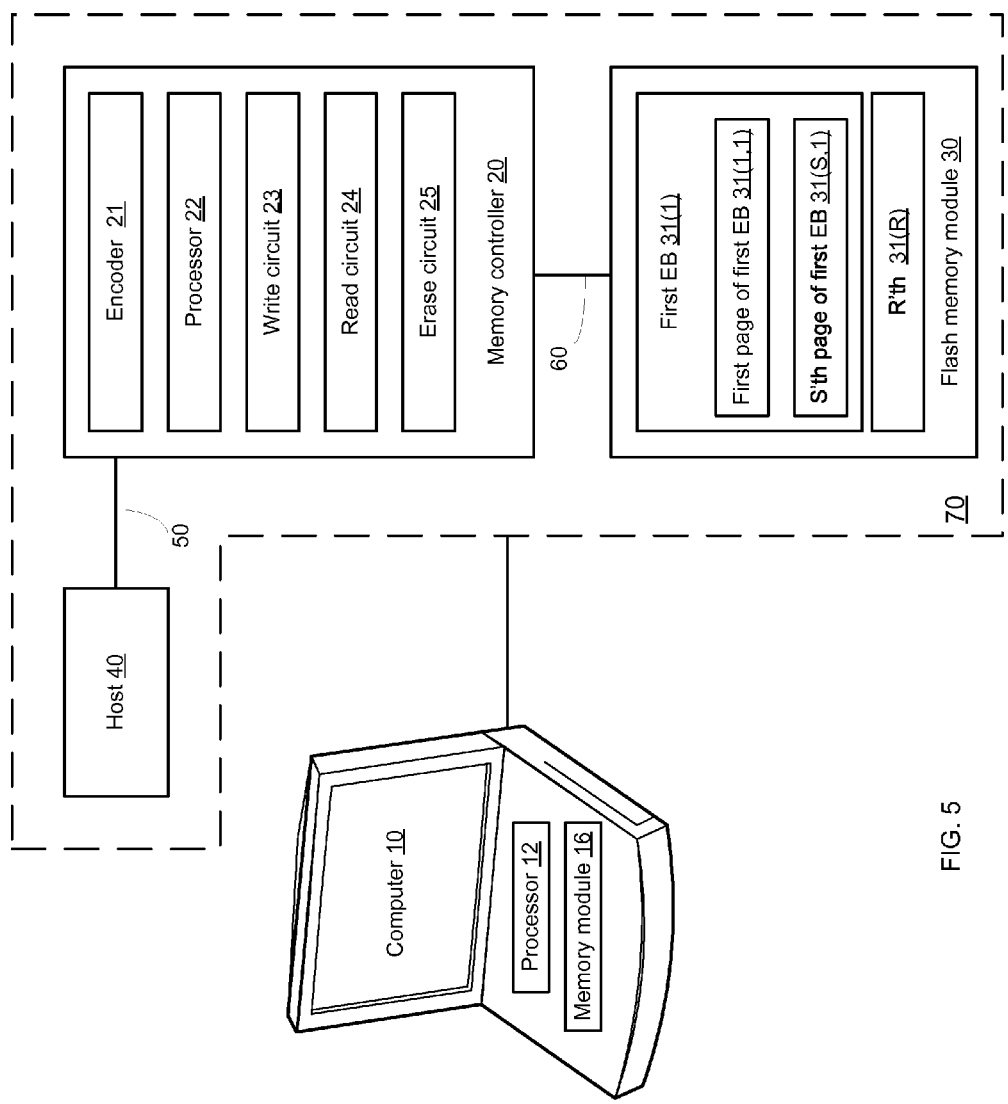
FIG. 5 illustrates a device and a user computer according to an embodiment of the invention.

FIG. 5 illustrates a device 70 and a user computer 10 according to an embodiment of the invention.

User computer 10 may be a laptop, desktop, server or any type of computer. It may include components such as a processor and a memory module 16. The user computer may allow a user to execute the stages of method 300.

Device 70 may be a computerized device that may include a host computer 40 (that may be any type of a processor), a memory controller 20 and a flash memory module 30. Channel (link) 50 couples the memory controller 20 to the host computer 40 and channel 60 coupled the memory controller 20 to the flash memory module 30. Transactions over at least one of these channels may be limited by the flash memory transaction size.

Memory controller 20 can execute the stages of method 300 and/or the stages of method 400.

The memory controller 20 is illustrated as including an encoder 21 (for encoding), a processor 22 (general purpose processor and/or dedicated processor that may execute software/firmware/middleware), a write circuit 23, a read circuit 24 and an erase circuit 25 for writing data to the flash memory module, reading data from the flash memory module and for erasing erase blocks of the flash memory module respectively.

The flash memory module 30 may include multiple erase blocks (such as first till R'th erase blocks 31(1)-31(R), R being a positive integer. Each erase block has multiple pages such as first till S'th pages of first erase block 31(1,1)-31(S,1), S being a positive integer.

Performance Impact

Variables: π—Page size; ξ—CW size (≈4 KB); NBW—channel BW

Prior art "configuration for performance"

Scenarios "Best Case": 4 KB alignment is restored each 2 pages and codeword sizes: ξ0=4 KB-ϵ, ξ1=4 KB+ϵ

"Worst case": 4 KB has negligible probability to be aligned to page or Code Word.

Calculations: Probability of 4 KB data to cross page boundaries: Best case:

$$P_{Cross} = \frac{4KB}{2\pi}, \text{ Worst case: } P_{Cross} = \frac{4KB}{\pi}.$$

Probability of 4 KB data to be contained within single ~4 KB codeword Best case:

$$P_{Contain} = \frac{4KB}{2\pi}.$$

Because only the segment that resides in page with 41 and is aligned to page boundary will be fully included in CW.

Worst case: Probability is negligible $P_{contain} \approx 0$.

Random Read performance [IOPS]:

$$1 \Big/ \Big(tR \cdot (1 + P_{Cross}) + \frac{4KB}{NBW} \cdot (2 - P_{Contain})\Big).$$

Best Case:

$$1 \Big/ \Big(tR \cdot \Big(1 + \frac{4KB}{2\pi}\Big) + \frac{4KB}{NBW} \cdot \Big(2 - \frac{4KB}{2\pi}\Big)\Big) = \pi \Big/ \Big(tR \cdot (\pi + 2KB) + \frac{4KB}{NBW} \cdot (2\pi - 2KB)\Big)$$

Worst Case:

$$1 \Big/ \Big(tR \cdot \Big(1 + \frac{4KB}{\pi}\Big) + \frac{4KB}{NBW} \cdot (2 - 0)\Big) = \pi \Big/ \Big(tR \cdot (\pi + 4KB) + \frac{4KB}{NBW} \cdot 2\pi\Big)$$

Random Read channel load [IOPS]:

$$\frac{NBW}{4KB \cdot (2 - P_{Contain})}$$

Best Case:

$$\frac{NBW}{4KB \cdot \Big(2 - \frac{4KB}{2\pi}\Big)} = \frac{NBW \cdot \pi}{4KB \cdot (2\pi - 2KB)}$$

Worst Case:

$$\frac{NBW}{4KB \cdot (2 - 0)} = \frac{NBW}{8KB}$$

In short, the channel load is approximately twice that of a system that uses constant 4 KB codes (no variable coding). This leads to twice the channel bandwidth requirements, power requirements, etc.

Suggested "configuration for performance

The suggested configuration decreases the impact of lack of alignment between codeword and 4 KB data segment.

Most codewords are aligned to data. I.e. most codewords contain exactly 4 KB payload data, which is aligned to logical address. Only a small fraction of codewords contain different amount of data. Later codewords used to handle page boundaries. Those codewords are minority and thus low performance impact.

Some data segments are not fully included within the page, i.e. they cross page boundary. This occurs on page start or end. Those cases get special treatment.

Two options may be used: (1) partial chunk enclosure within smaller codeword, (2) concatenate partial chunk with nearby full 4 KB data segment and enclose within larger codeword. Consideration which policy to use may come from reliability consideration: larger codeword usually better reliability. On other hand ECC engine capabilities may limit the maximal codeword size.

Probability of 4 KB data to cross page boundaries stays the same.

Probability of 4 KB data to be contained within single ~4 KB codeword is improved significantly: Best case:

$$P_{Contain} = 1 - \frac{4KB}{2\pi}.$$

Because only the segment that crosses pages is divided between 2 codewords.

Worst case:

$$P_{Contain} \cong 1 - \frac{4KB}{\pi}$$

all boundary 4 KB segments are divided

Random Read performance [IOPS]: Best Case:

$$1 \Big/ \Big(tR \cdot \Big(1 + \frac{4KB}{2\pi}\Big) + \frac{4KB}{NBW} \cdot \Big(2 - \Big(1 - \frac{4KB}{2\pi}\Big)\Big)\Big) = \pi \Big/ \Big(tR \cdot (\pi + 2KB) + \frac{4KB}{NBW} \cdot (\pi + 2KB)\Big)$$

Worst Case $$1 \Big/ \Big(tR \cdot \Big(1 + \frac{4KB}{\pi}\Big) + \frac{4KB}{NBW} \cdot \Big(2 - \Big(1 - \frac{4KB}{\pi}\Big)\Big)\Big) = \pi \Big/ \Big(tR \cdot (\pi + 4KB) + \frac{4KB}{NBW} \cdot (\pi - 4KB)\Big)$$

Random Read channel load [IOPS] Best Case:

$$\frac{NBW}{4KB \cdot \left(2 - \left(1 - \frac{4KB}{2\pi}\right)\right)} = \frac{NBW \cdot \pi}{4KB \cdot (\pi + 2KB)},$$

Worst Case:

$$\frac{NBW}{4KB \cdot \left(2 - \left(1 - \frac{4KB}{\pi}\right)\right)} = \frac{NBW \cdot \pi}{4KB \cdot (\pi + 4KB)}$$

In short, the channel load is now much closer to that of a system that uses constant 4 KB codes (no variable coding). Thus allowing saving in channel bandwidth requirements, power requirements and still keep higher reliability compared to a system with aligned and constant 4 KB code sizes.

Improvement in pure Random Read performance [IOPS] Best Case:

$$\frac{\pi \Big/ \left(tR(\pi + 2KB) + \frac{4KB}{NBW}(\pi + 2KB)\right)}{\pi \Big/ \left(tR(\pi + 2KB) + \frac{4KB}{NBW}(2\pi - 2KB)\right)} \xrightarrow{\pi \gg 4KB, tR \gg \frac{4KB}{NBW}} \approx \frac{\left(tR + \frac{8KB}{NBW}\right)}{\left(tR + \frac{4KB}{NBW}\right)} \approx 1$$

Worst Case:

$$\frac{\pi \Big/ \left(tR(\pi + 4KB) + \frac{4KB}{NBW} \cdot (\pi - 4KB)\right)}{\pi \Big/ \left(tR(\pi + 4KB) + \frac{4KB}{NBW} \cdot 2\pi\right)} \xrightarrow{\pi \gg 4KB, tR \gg \frac{4KB}{NBW}} \approx \frac{\left(tR + \frac{8KB}{NBW}\right)}{\left(tR + \frac{4KB}{NBW}\right)} \approx 1$$

Improvement in channel load [IOPS]
Best Case:

$$\frac{\frac{NBW \cdot \pi}{4KB \cdot (\pi + 2KB)}}{\frac{NBW \cdot \pi}{4KB \cdot (2\pi - 2KB)}} = \frac{(2\pi - 2KB)}{(\pi + 2KB)} \xrightarrow{\pi \gg 2KB} \approx 2.$$

Worst Case:

$$\frac{\frac{NBW \cdot \pi}{4KB \cdot (\pi + 4KB)}}{\frac{NBW}{8KB}} = \frac{2\pi}{(\pi + 4KB)} \xrightarrow{\pi \gg 4KB} \approx 2$$

Accordingly, assuming a page size is significantly larger than 4 KB (i.e. $\pi \gg 4$ KB). E.g. page of 16 or 32 KB, channel BW is high enough, so 4 KB transfer time is significantly lower than tR $$\left(tR \gg \frac{4KB}{NBW}\right).$$

E.g.

$$\left(tR = 50us\right) \gg \left(\frac{4KB}{NBW = \frac{200MB}{s}} = 20us\right)$$

Pure Random Read performance seems not affected significantly.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following magnetic storage media including disk and tape storage media; optical storage media such as compact disk media (e.g., CD-ROM, CD-R, etc.) and digital video disk storage media; nonvolatile memory storage media including semiconductor-based memory units such as flash memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for managing an encoding process, the method comprises:
   receiving or determining, by a processor, (i) code rates for multiple pages of a flash memory, and (ii) sizes of a plurality of data segments to be stored in the multiple pages after being encoded to provide multiple codewords;

determining, by the processor, sizes of the multiple codewords while maintaining the code rates for the multiple pages and minimizing a number of split data segments out of the plurality of data segments, wherein each split data segment is split between at least two codewords of the multiple codewords, wherein a retrieval, from the flash memory, of each split data segment that is stored in the flash memory and is split between the at least two codewords involves a retrieval of the at least two codewords; and sending to an encoder information about the sizes of the multiple codewords.

2. The method according to claim 1 further comprising receiving or determining, by the processor a flash memory transaction size; and wherein the determining of the sizes of the multiple codewords is further responsive to the flash memory transaction size.

3. The method according to claim 1, comprising determining the sizes of multiple codewords to minimize a number of codewords that comprise at least a portion of two data segments.

4. The method according to claim 1, comprising determining the sizes of the multiple codewords so that at least one page of the multiple pages comprises codewords that differ from each other by a size of redundancy.

5. The method according to claim 1, comprising determining the sizes of multiple codewords to allow only up to a single codeword per page to comprise at least a portion of two data segments.

6. The method according to claim 1, wherein the code rates for the multiple pages comprise a first code rate that is higher than a second code rate; wherein the first code rate is associated with a first page of the multiple pages and the second code rate is associated with a second page of the multiple pages.

7. The method according to claim 6 comprising preventing the second page from storing a codeword that comprises at least a portion of two data segments.

8. The method according to claim 6 wherein at least one codeword of the first page comprises at least a portion of two data segments.

9. The method according to claim 1 further comprising receiving the plurality of data segment and encoding the plurality of data segments to provide the multiple codewords, wherein the encoding is responsive to the information about the sizes of the multiple codewords.

10. A method for encoding data segments, the method comprises:

receiving, by an encoder, information about sizes of multiple codewords to be generated by the encoder by encoding a plurality of codewords; wherein the sizes of the multiple codewords were determined (a) in response to code rates for multiple pages of a flash memory and sizes of the plurality of data segments, and (b) while maintaining the code rates for the multiple pages and minimizing a number of split data segments out of the plurality of data segments, wherein each split data segment is split between at least two codewords of the multiple codewords, wherein a retrieval, from the flash memory, of each split data segment that is stored in the flash memory and is split between the at least two codewords involves a retrieval of the at least two codewords;

receiving, by the encoder, the plurality of data segment; and encoding, by the encoder, the plurality of data segments to provide the multiple codewords, wherein the encoding is responsive to the information about the sizes of the multiple codewords.

11. A non-transitory computer readable medium that stores instructions that once executed by an encoder cause the encoder to execute the stages of: receiving information about sizes of multiple codewords to be generated by the encoder by encoding a plurality of codewords; wherein the sizes of the multiple codewords were determined (a) in response to code rates for multiple pages of a flash memory and sizes of the plurality of data segments, and (b) while maintaining the code rates for the multiple pages and minimizing a number of split data segments out of the plurality of data segments, wherein each split data segment is split between at least two codewords of the multiple codewords, wherein a retrieval, from the flash memory, of each split data segment that is stored in the flash memory and is split between the at least two codewords involves a retrieval of the at least two codewords; receiving the plurality of data segment; and encoding the plurality of data segments to provide the multiple codewords, wherein the encoding is responsive to the information about the sizes of the multiple codewords.

12. The non-transitory computer readable medium according to claim 11 that stores instructions for receiving or determining, by the processor a flash memory transaction size; and wherein the determining of the sizes of the multiple codewords is further responsive to the flash memory transaction size.

13. The non-transitory computer readable medium according to claim 11, that stores instructions for determining the sizes of multiple codewords to minimize a number of codewords that comprise at least a portion of two data segments.

14. The non-transitory computer readable medium according to claim 11, that stores instructions for determining the sizes of the multiple codewords so that at least one page of the multiple pages comprises codewords that differ from each other by a size of redundancy.

15. The non-transitory computer readable medium according to claim 11, that stores instructions for determining the sizes of multiple codewords to allow only up to a single codeword per page to comprise at least a portion of two data segments.

16. The non-transitory computer readable medium according to claim 11, wherein the code rates for the multiple pages comprise a first code rate that is higher than a second code rate; wherein the first code rate is associated with a first page of the multiple pages and the second code rate is associated with a second page of the multiple pages.

17. The non-transitory computer readable medium according to claim 16 that stores instructions for preventing the second page from storing a codeword that comprises at least a portion of two data segments.

18. The non-transitory computer readable medium according to claim 16 wherein at least one codeword of the first page comprises at least a portion of two data segments.

19. The non-transitory computer readable medium according to claim 11 that stores instructions for receiving the plurality of data segment and encoding the plurality of data segments to provide the multiple codewords, wherein the encoding is responsive to the information about the sizes of the multiple codewords.

20. A non-transitory computer readable medium that stores instructions that once executed by a processor cause the processor to execute the stage of receiving or determining (i) code rates for multiple pages of a flash memory, and (ii) sizes of a plurality of data segments to be stored in the multiple pages after being encoded to provide multiple codewords; determining sizes of the multiple codewords while maintaining the code rates for the multiple pages and minimizing a number of split data segments out of the plurality of data segments, wherein each split data segment is split between at least two codewords of the multiple codewords, wherein a retrieval, from the flash memory, of each split data segment that is stored in the flash memory and is split between the at least two codewords involves a retrieval of the at least two codewords; and sending to an encoder information about the sizes of the multiple codewords.

21. A memory controller that comprises an encoder; wherein the encoder is configured to:
receive information about sizes of multiple codewords to be generated by the encoder by encoding a plurality of codewords; wherein the sizes of the multiple codewords were determined (a) in response to code rates for multiple pages of a flash memory and sizes of the plurality of data segments, and (b) while maintaining the code rates for the multiple pages and minimizing a number of split data segments out of the plurality of data segments, wherein each split data segment is split between at least two codewords of the multiple codewords, wherein a retrieval, from the flash memory, of each split data segment that is stored in the flash memory and is split between the at least two codewords involves a retrieval of the at least two codewords;
receive the plurality of data segment; and
encode the plurality of data segments to provide the multiple codewords, wherein the encoding is responsive to the information about the sizes of the multiple codewords.

\* \* \* \* \*